United States Patent
Keyser et al.

(10) Patent No.: US 7,791,031 B2
(45) Date of Patent: Sep. 7, 2010

(54) NEUTRON DETECTION STRUCTURE

(75) Inventors: Thomas R. Keyser, Plymouth, MN (US); Cheisan J. Yue, Roseville, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/135,787

(22) Filed: Jun. 9, 2008

(65) Prior Publication Data

US 2009/0302227 A1    Dec. 10, 2009

(51) Int. Cl.
*G01T 3/08* (2006.01)
(52) U.S. Cl. .................................. 250/370.05
(58) Field of Classification Search ............ 250/370.05, 250/390.01
See application file for complete search history.

(56) References Cited

U.S. PATENT DOCUMENTS

| | | | |
|---|---|---|---|
| 5,281,822 A | 1/1994 | Albrecht et al. | 250/370.05 |
| 5,319,210 A | 6/1994 | Moscovitch | 250/474 |
| 5,444,301 A | 8/1995 | Song et al. | 257/737 |
| 6,075,261 A | 6/2000 | Hossain et al. | 257/252 |
| 6,765,978 B1 | 7/2004 | Kronenberg et al. | 376/147 |
| 6,771,730 B1 | 8/2004 | Dowben | |
| 6,841,841 B1 | 1/2005 | Blish, II et al. | 257/429 |
| 6,867,444 B1 | 3/2005 | Hughes | 257/252 |
| 6,909,159 B2 | 6/2005 | Friend et al. | 257/428 |
| 7,265,359 B2 | 9/2007 | Ambrosi et al. | 250/390.01 |
| 7,271,389 B2 | 9/2007 | August et al. | 250/370.05 |
| 7,332,726 B2 | 2/2008 | Friedman | |
| 7,335,891 B2 | 2/2008 | Kniss et al. | 250/370.11 |
| 7,491,948 B2 | 2/2009 | Gordon | |

(Continued)

FOREIGN PATENT DOCUMENTS

WO    WO 2005/088719 A1    9/2005

(Continued)

OTHER PUBLICATIONS

Barthe, Jean. "Electronic Dosimeters Based on Solid State Detectors," Nuclear Instruments and Methods in Physics Research B 184 (2001) 158-189, 2001 Elsevier Science B.V.

(Continued)

*Primary Examiner*—David P Porta
*Assistant Examiner*—Marcus H Taningco
(74) *Attorney, Agent, or Firm*—Shumaker & Sieffert, P.A.

(57) ABSTRACT

A neutron detection structure built from a Silicon-On-Insulator memory cell includes a conversion layer for converting incident neutrons into emitted charged particles, a device layer for receiving the emitted charged particles, a buried oxide layer separating the conversion layer from the device layer and directly adjacent to the conversion layer and the device layer, an isolation layer, a passivation layer formed on the isolation layer opposite the device layer and buried oxide layer, a carrier adhered by an adhesion layer to the passivation layer opposite the isolation layer, and a plurality of conductive contacts to provide electrical contact to the device layer. A corresponding method for fabricating such a structure includes permanently bonding a carrier to a passivated SOI SRAM wafer, removing an insulative substrate, depositing a conversion layer where at least a portion of the insulative substrate was removed, and forming at least one opening in the conversion layer and the buried oxide layer to provide at least one electrical contact to the device layer.

18 Claims, 6 Drawing Sheets

U.S. PATENT DOCUMENTS

| | | |
|---|---|---|
| 2004/0227094 A1 | 11/2004 | Tompa et al. .......... 250/370.01 |
| 2005/0071730 A1 | 3/2005 | Moyer |
| 2008/0017804 A1 | 1/2008 | Krishnamoorthy et al. ...................... 250/370.05 |
| 2008/0165605 A1 | 7/2008 | Fisch |
| 2008/0308747 A1 | 12/2008 | Gordon |
| 2009/0166550 A1* | 7/2009 | Gazda et al. ................. 250/392 |

FOREIGN PATENT DOCUMENTS

| | | |
|---|---|---|
| WO | WO 2006/085307 A1 | 8/2006 |
| WO | WO 2005/076779 A1 | 8/2008 |

OTHER PUBLICATIONS

Bartlett et al., "Active Neutron Personal Dosemeters—A Review of Current Status," Radiation Protection Dosimetry, vol. 86, No. 2, pp. 107-122 (1999) Nuclear Technology Publishing.

J.C. Lund, F. Sinclair & G. Entine, Neutron Dosimeter Using a Dynamic Random Access Memory as a Sensor, 33 IEEE Transactions on Nuclear Science, Feb. 1986.

* cited by examiner

NEUTRON DETECTION STRUCTURE

FIELD

The present invention relates to a structure for providing sensitive detection capability for neutrons, and more particularly, to a neutron detection structure capable of implementation in a mass-produced device.

BACKGROUND

Large numbers of cargo containers, ships, and planes are received at shipping ports, borders, and transportation centers each day and each one presents a potential opportunity for unauthorized delivery of a nuclear device, such as a radiological weapon (e.g. a small dirty bomb). In addition, smuggling of devices out of a location is also a concern in order to keep terrorists and other unauthorized entities from obtaining such devices.

While many types of radiation detectors have been developed, one of the more promising types appears to be a Silicon-On-Insulator (SOI) Static Random Access Memory (SRAM) structure used in conjunction with one or more neutron conversion layers, such as those doped with boron (e.g. boron-10). For example, U.S. Pat. Nos. 6,867,444 and 7,271,389, assigned to the United States Navy, set forth two such devices and are hereby incorporated by reference herein in their entireties. However, these devices require substrates with a heavily doped buried layer, which is complicated to prepare and process. Post-circuit processing is also made difficult due to the conversion layer being buried in the substrate.

Therefore, an neutron detection structure that is more easily manufacturable and utilizes commercially available SOI SRAMs would be desirable. The structure should allow for unattended detection of neutrons emitted from small nuclear devices, for example.

SUMMARY

A neutron detection structure built from a Silicon-On-Insulator memory cell includes a conversion layer for converting incident neutrons into emitted charged particles, a device layer for receiving the emitted charged particles, a buried oxide layer separating the conversion layer from the device layer and directly adjacent to the conversion layer and the device layer, an isolation layer, a passivation layer formed on the isolation layer opposite the device layer and buried oxide layer, a carrier adhered by an adhesion layer to the passivation layer opposite the isolation layer, and a plurality of conductive contacts to provide electrical contact to the device layer. A corresponding method for fabricating such a structure includes permanently bonding a carrier to a passivated SOI SRAM wafer, removing an insulative substrate, depositing a conversion layer where at least a portion of the insulative substrate was removed, and forming at least one opening in the conversion layer and the buried oxide layer to provide at least one electrical contact to the device layer.

DETAILED DESCRIPTION OF PRESENTLY PREFERRED EMBODIMENTS

Introduction

The embodiments described herein provide sensitive detection capabilities for neutrons, one of the decay products of the fissionable material used in a nuclear device. The underlying detection technology is described in further detail in U.S. Pat. Nos. 6,867,444 and 7,271,389, both of which are incorporated by reference herein in their entireties. In accordance with the present embodiments, a structure for implementing a proposed neutron detection film stack in a mass-produced device is set forth.

In general, the device is fabricated from an SOI CMOS SRAM circuit configured to count alpha-particle induced upsets. Low temperature wafer bonding, wafer thinning, and back side processing techniques are used to create a finished device comprising a new carrier wafer, permanently attached to the thin SRAM device having a proximate neutron conversion film and conductive wires or bumps to connect the device to package leads.

The preferred structure is made by first permanently bonding an inert carrier substrate to the surface of a completed IC wafer using a spin-on dielectric or other adhesive material. The original substrate is then removed from the IC layer by grinding, polishing, and chemically etching the silicon to expose the underside of the buried oxide layer. The neutron conversion layer is then deposited onto the exposed buried oxide surface. Openings through the material and the buried oxide layer are then formed to expose the underside of the circuit metallization pads and enable connections between the device and the package using bond wires or conductive bumps. An equivalent structure can be formed using a "debondable" SOI wafer to transfer the active device layer onto a suitable carrier. Debondable SOI wafers have been described by Tracit, a subsidiary of SOITEC.

Figure 1:
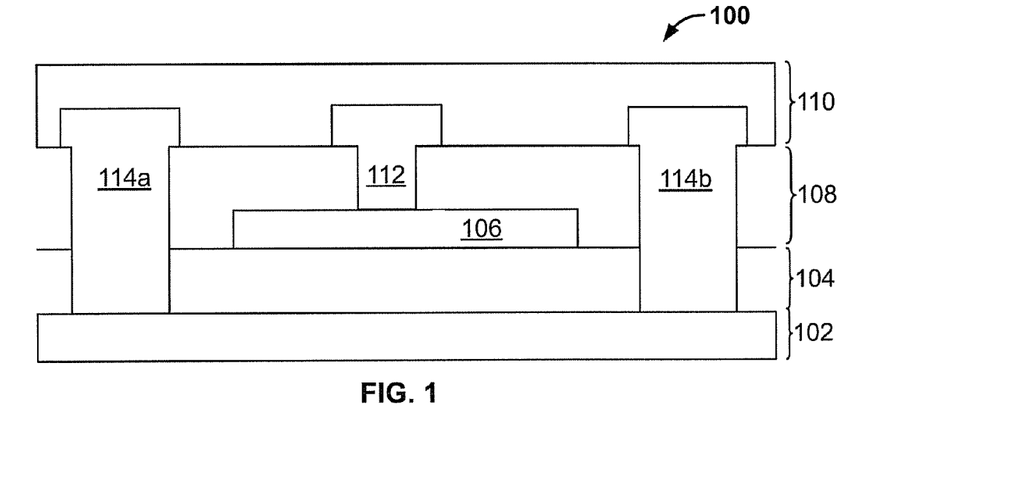
FIG. 1 illustrates a passivated device wafer, according to an embodiment of the present invention.

FIG. 1 illustrates a passivated device wafer 100, according to an embodiment of the present invention. The wafer 100 may be a completed integrated circuit wafer, such as one containing one or more Static Random Access Memory (SRAM) elements and/or other circuitry. The example shown in FIG. 1 is a SOI device wafer.

The wafer 100 includes a substrate 102 (i.e. a "handle" wafer) that is preferably bulk silicon. An insulator, such as buried oxide (BOX) layer 104 overlies the substrate 102. A device layer 106 overlies the BOX layer 104 and is appropriately patterned to provide much of the device functionality (e.g. SRAM cell(s)/array(s)). The device layer 106 is preferably silicon and overlies a silicon-dioxide BOX layer 104, which together serve as the basic SOI structure. An isolation layer 108 partially or completely surrounds the sides and upper surface(s) of the device layer 106. A passivation layer 110 overlies the isolation layer 108. As illustrated, a contact 112 (e.g. a metallization) may provide electrical connectivity to the device layer 106 from the passivation layer 112. In addition, top-side contacts 114a-b (e.g. one or more metallizations) to the substrate 102 may also be provided. The general structure of wafer 100, while being a known structure for typical SOI device fabrication, serves as a starting point in manufacturing a neutron detector in accordance with embodiments of the present invention.

Figure 2:
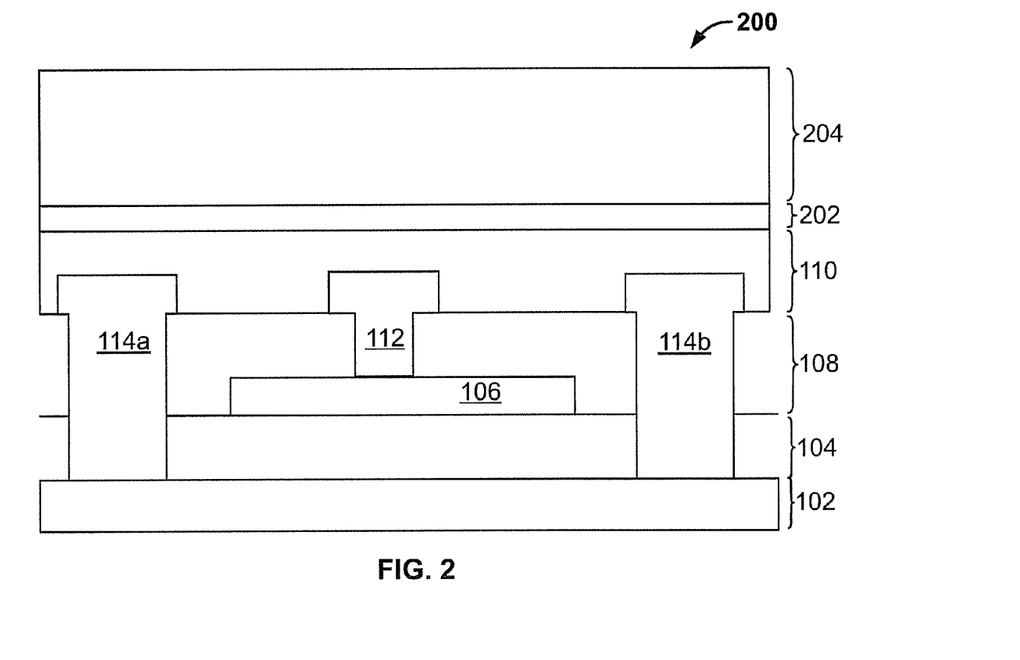
FIG. 2 illustrates a structure corresponding to the passivated device wafer at a subsequent state of processing, according to an embodiment of the present invention.

FIG. 2 illustrates a structure 200 corresponding to the passivated device wafer 100 at a subsequent state of processing, according to an embodiment of the present invention. An adhesion layer 202 permanently bonds the passivated circuit wafer 100 to a carrier 204, forming a device wafer with a bonded carrier. A low-temperature bonding process is preferably used.

Figure 3:
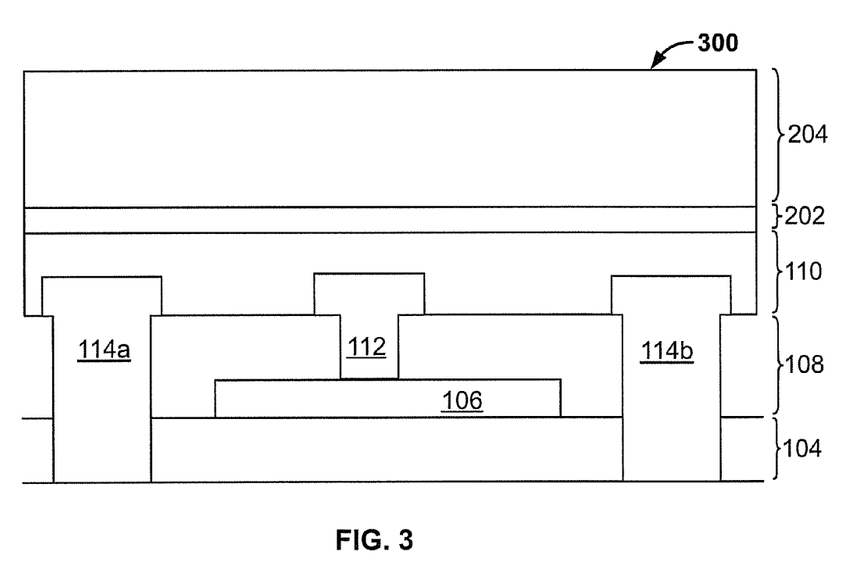
FIG. 3 illustrates the structure of FIG. 2 at a subsequent stage of processing, according to an embodiment of the present invention.

FIG. 3 illustrates a structure 300 corresponding to the structure 200 of FIG. 2 at a subsequent stage of processing, according to an embodiment of the present invention. The substrate 102 (the handle wafer) has been removed. Removal may include grinding, polishing, and etching off the handle wafer. Other removal techniques may also be used. Alternatively, a "debondable" SOI wafer could be used to isolate the thin device layer 106. Such a debonded SOI wafer would allow one to transfer the active device layer onto a suitable carrier. Debondable SOI wafers have been described and offered by Tracit, a subsidiary of SOITEC, based in Bernin, France.

Figure 4:
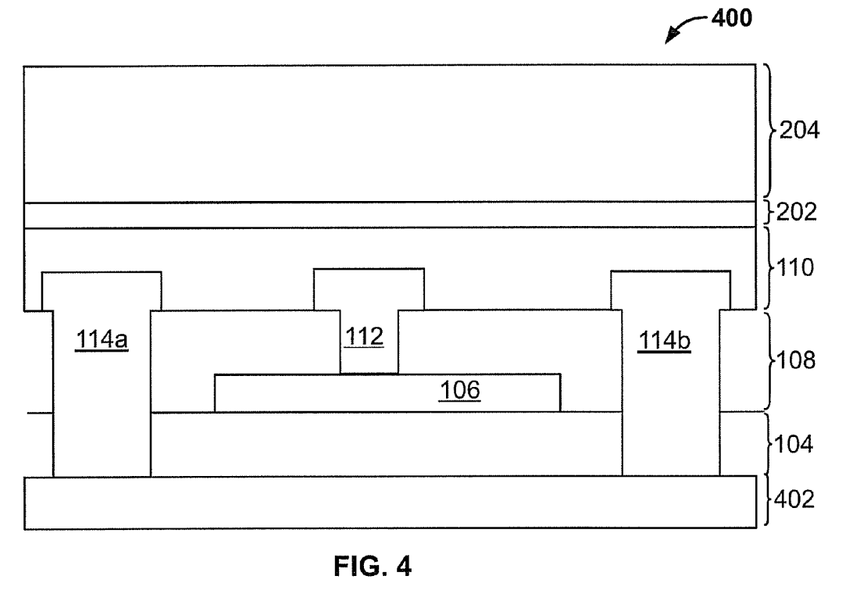
FIG. 4 illustrates the structure of FIG. 3 at a subsequent stage of processing, according to an embodiment of the present invention.

FIG. 4 illustrates a structure 400 corresponding to the structure 300 of FIG. 3 at a subsequent stage of processing, according to an embodiment of the present invention. A neutron detection layer 402 is deposited on the BOX layer 104, such as opposite the device layer 106. The neutron detection layer 402 is preferably a boron-doped conversion layer that converts incident neutrons into charged particles. At least some of the charged particles are received at the device layer 106 and cause single event upsets (SEUs) that may be perceived as bit changes (e.g. in an SRAM in the device layer 106). In addition to a boron-doped conversion layer, other types of neutron detection layers, such as the ones described in U.S. Pat. Nos. 6,867,444 and 7,271,389, may alternatively be used.

Figure 5:
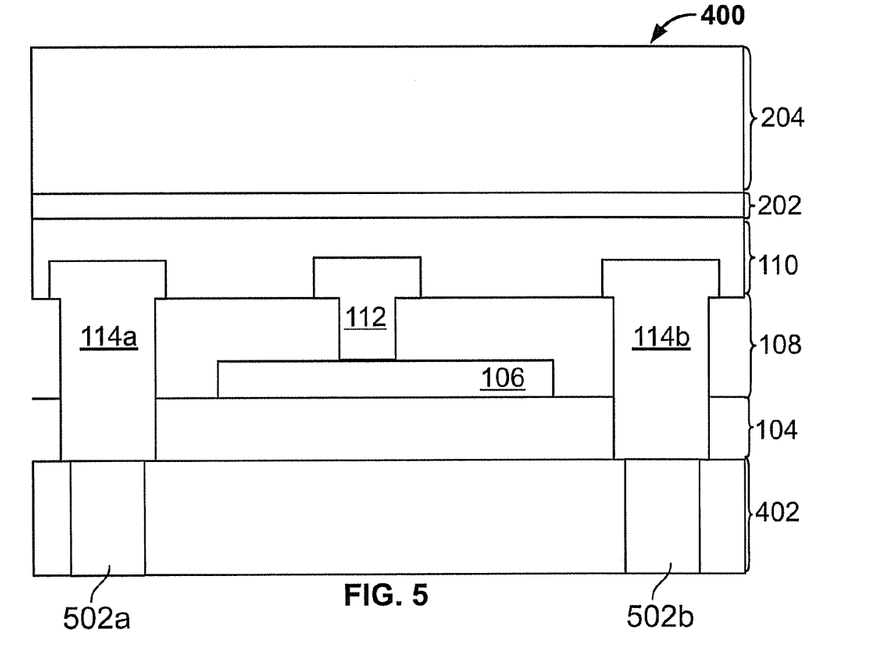
FIG. 5 illustrates the structure of FIG. 4 at a subsequent stage of processing, according to an embodiment of the present invention, according to an embodiment of the present invention.

FIG. 5 illustrates the structure 400 of FIG. 4 at a subsequent stage of processing, according to an embodiment of the present invention. A plurality of vias 502a-b provides access to the top-side contacts 114a-b, so that one or more electrical connections can be made to the device. The vias 502a-b may be created by appropriately patterning openings (such as by an etching process), so that the vias 502a-b align with the top-side contacts 114a-b. These vias provide access to the top-side metallization and thereby enable control of the SRAM circuitry above.

Figure 6A:
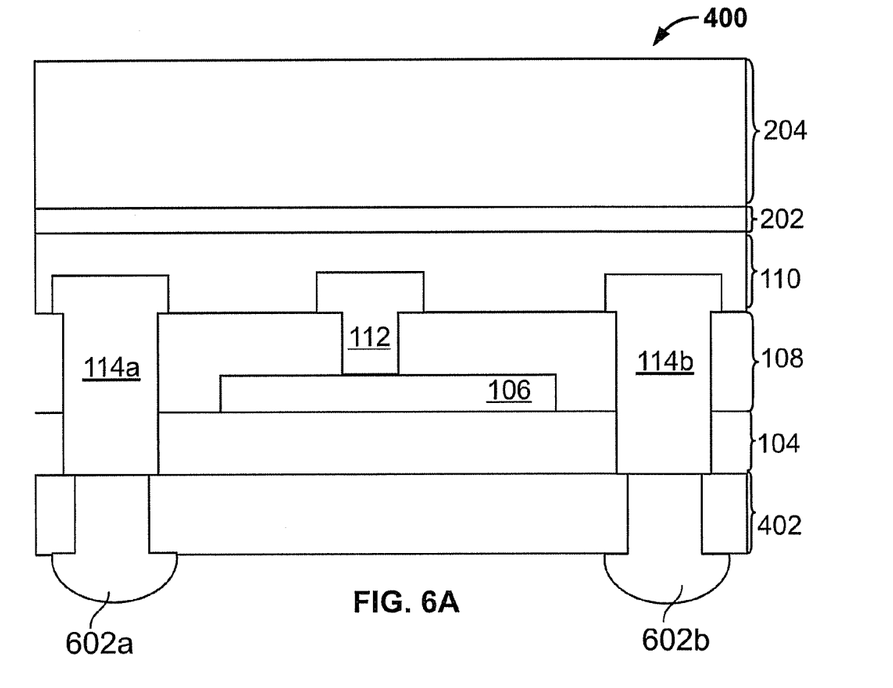
FIG. 6A illustrates the structure of FIG. 5 at a subsequent stage of processing, according to a first embodiment of the present invention.

FIG. 6A illustrates the structure 400 of FIG. 5 at a subsequent stage of processing, according to a first embodiment of the present invention. Conductive bumps 602a-b have been formed in the vias 502a-b. The conductive bumps 602a-b may comprise gold, nickel, palladium, copper, silver, aluminum, tungsten, various alloys, solder, and/or conductive epoxy, for example. Other conductive materials may also be used for the conductive bumps 602a-b. The conductive bumps 602a-b may be used to make contact with bond pads on a circuit board, for example. As shown, the conductive bumps 602a-b preferably protrude beyond the surface of the detection layer 402.

Figure 6B:
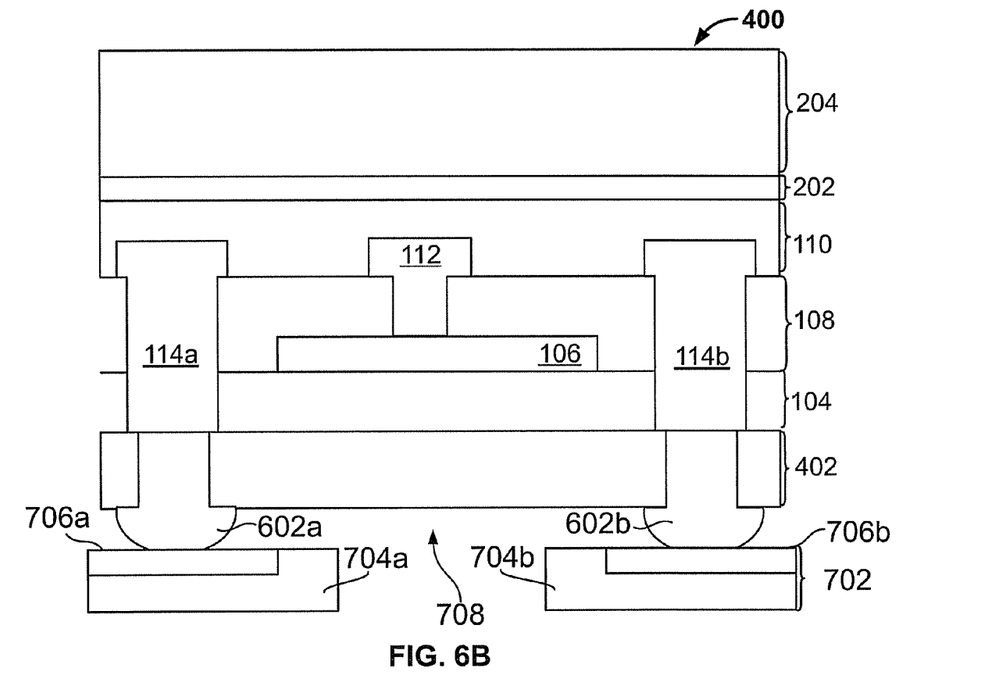
FIG. 6B illustrates the structure of FIG. 6A on an open package lead frame, according to the first embodiment of the present invention.

FIG. 6B illustrates the structure 400 of FIG. 6A on an open package lead frame 702, according to the first embodiment of the present invention. The open package lead frame 702 comprises lead frame portions 704a-b having conductive bond pads 706a-b for making electrical contact with the conductive bumps 602a-b. An opening 708 may be included if desired, to provide unabated access to the detection layer 402.

Figure 7A:
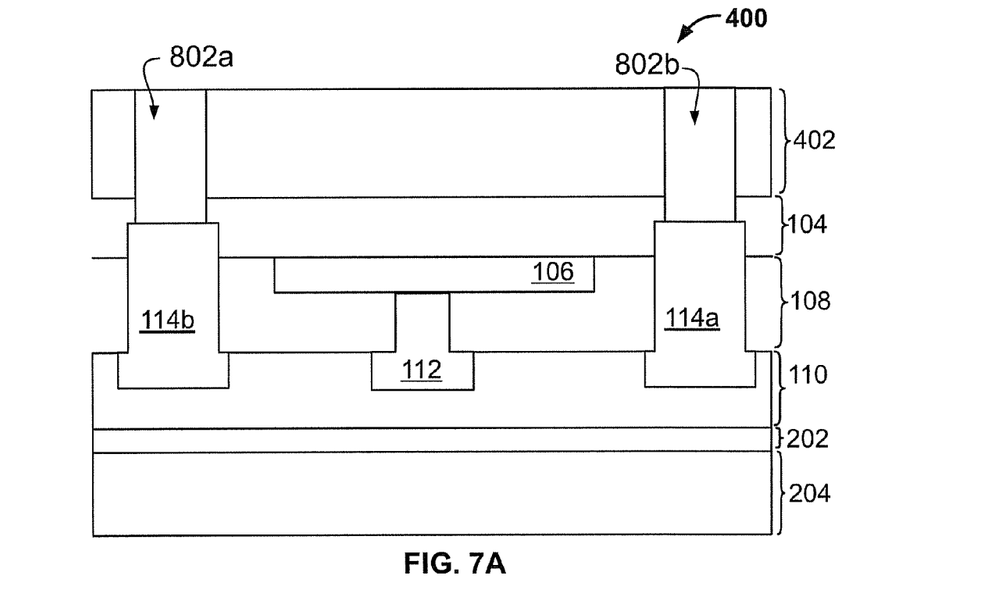
FIG. 7A illustrates the structure of FIG. 5 at a subsequent stage of processing, according to a second embodiment of the present invention.

FIG. 7A illustrates the structure 400 of FIG. 5 at a subsequent stage of processing, according to a second embodiment of the present invention, relating to a package assembly. FIG. 7A is similar to FIG. 5, except the structure 400 has been flipped upside-down and voids 802a-b to the contacts 114b-a are shown as being deeper than the vias 502a-b, penetrating partially into the BOX layer 104. Other depths may also be used; the goal is to make electrical contact with the contacts 114a-b while maintaining robustness.

Figure 7B:
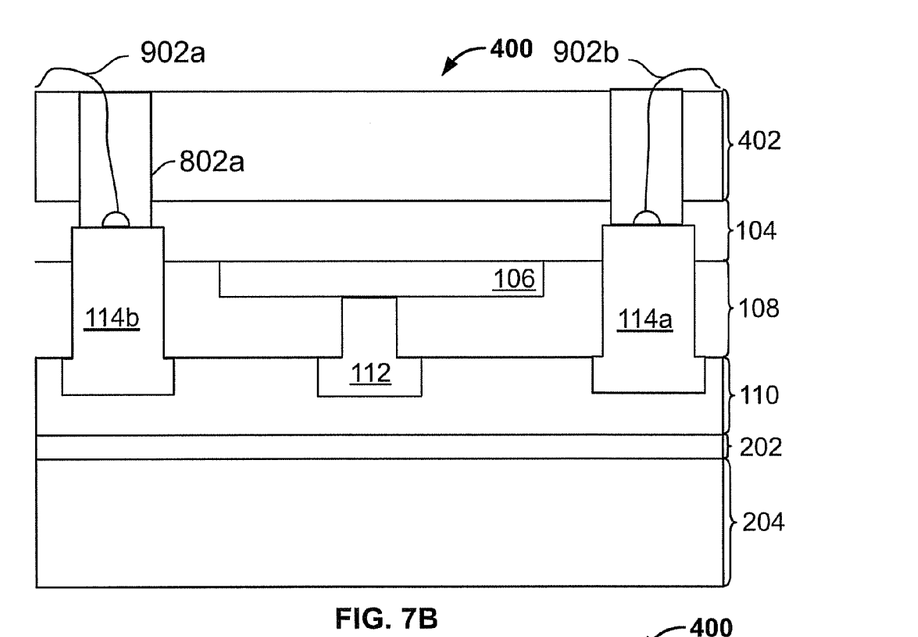
FIG. 7B illustrates the structure of FIG. 7A at a subsequent stage of processing, according to the second embodiment of the present invention.

FIG. 7B illustrates the structure 400 of FIG. 7A at a subsequent stage of processing, according to the second embodiment of the present invention. Wire bonds 902a-b have been secured to and placed in electrical contact with the contacts 114b-a. The wire bonds 902a-b can then be connected as appropriate to other circuitry (such as on a circuit board, for example). Such other circuitry could include a counting circuit for counting the number of radiation events detected by the neutron detection layer 402 and stored by the SRAM in the device layer 106, for example. In an alternative embodiment, additional packaging could surround the structure 400 shown in FIG. 7B, with the wire bonds 902a-b making direct or indirect contact (e.g. by connecting to other conductive leads associated with the packaging).

Figure 7C:
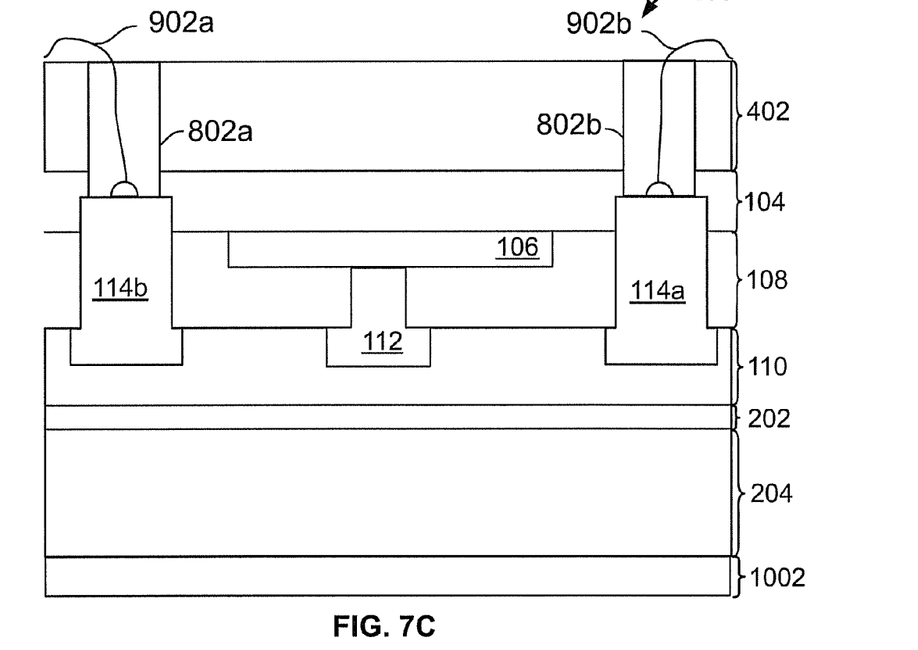
FIG. 7C illustrates the structure of FIG. 7B assembled as a package, according to the second embodiment of the present invention.

FIG. 7C illustrates the structure 400 of FIG. 7B assembled as a package, according to the second embodiment of the present invention. In this second embodiment, a package die pad layer 1002 is adjacent to the carrier 204. A molded resin package (not shown) having integral leads to which the wire bonds 902a-b may be connected may be included to provide improved robustness.

Figure 8:
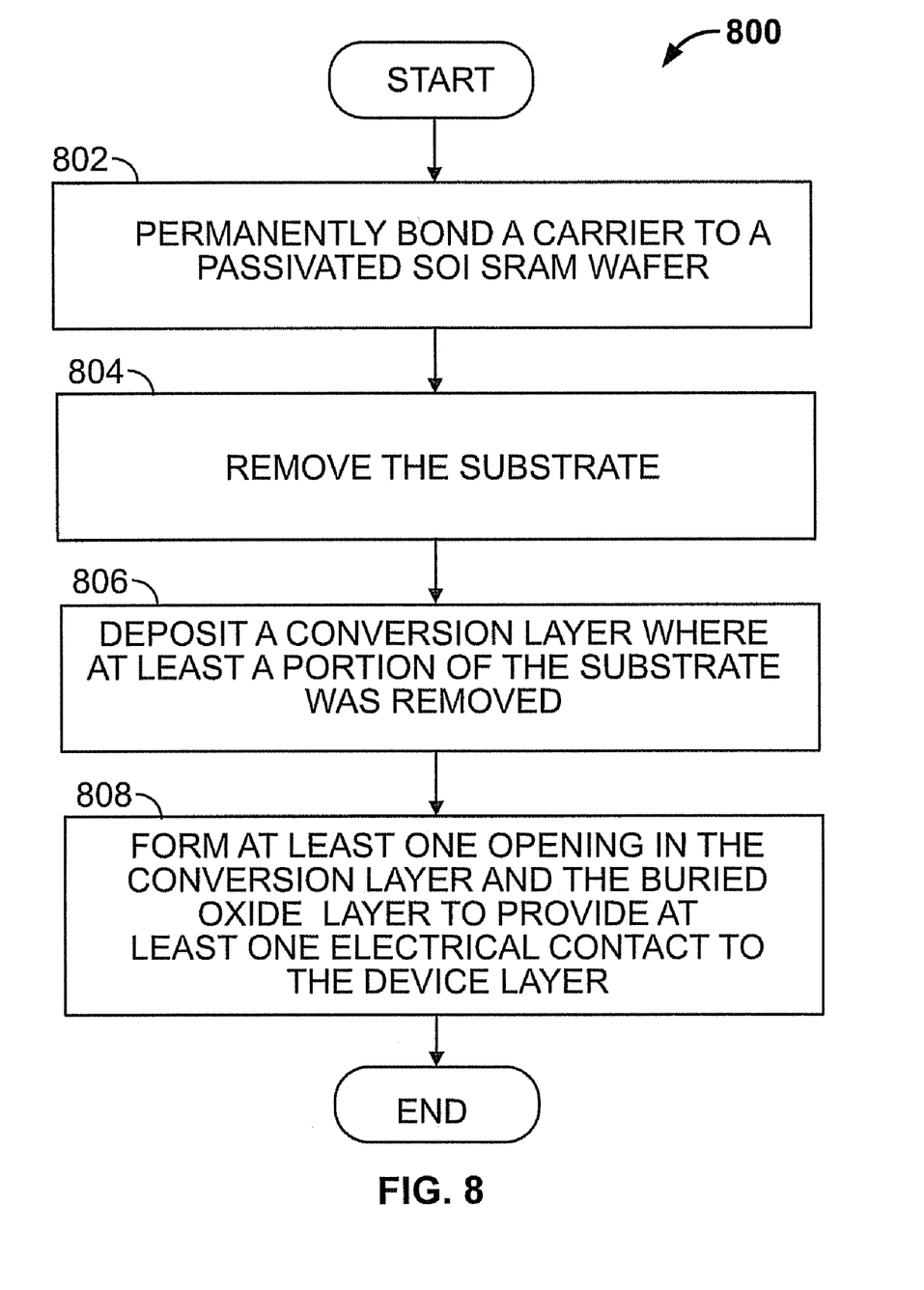
FIG. 8 illustrates a method 800 for fabricating a neutron detection structure in accordance with an embodiment of the present invention.

FIG. 8 illustrates a method 800 for fabricating a neutron detection structure in accordance with an embodiment of the present invention. The method 800 includes, at block 802, permanently bonding a carrier to a passivated SOI SRAM wafer. The passivated SOI SRAM wafer has a device layer, a buried oxide layer, and a substrate, such as an insulative substrate or semiconductor substrate. In block 804, the substrate is removed and in block 806, a conversion layer is deposited where at least a portion of the substrate was removed. In block 808, at least one opening is formed in the conversion layer and the buried oxide layer to provide at least one electrical contact to the device layer.

Removing the substrate (block 804) may be performed by grinding, polishing, and/or etching off the substrate (handle wafer) or it could instead be performed by debonding a commercially available debondable SOI wafer (for example, of the kind discussed above from SOITEC). The at least one electrical contact (block 808) could be a conductive bump filling the at least one opening or a wire bond extending into the at least one opening, for example.

The structure and method set forth above are not limited to any particular application described herein. The embodiments illustrated in FIGS. 1-7C are not drawn to scale, but are instead intended to effectively illustrate intermediate structure stages during manufacture of the neutron detection device.

Various arrangements and embodiments in accordance with the present invention have been described herein. It will be appreciated, however, that those skilled in the art will understand that changes and modifications may be made to these arrangements and embodiments as well as combination of the various embodiments without departing from the true scope and spirit of the invention, which is defined by the following claims.

We claim:

1. A neutron detection structure, comprising:
   a conversion layer for converting incident neutrons into emitted charged particle;
   a device layer for receiving the emitted charged particles;
   a buried oxide layer separating the conversion layer from the device layer and directly adjacent to the conversion layer and the device layer;
   an isolation layer, at least a portion of the isolation layer being opposite the device layer from the buried oxide layer;
   a passivation layer formed on the isolation layer opposite the device layer and buried oxide layer;
   a carrier adhered by an adhesion layer to the passivation layer opposite the isolation layer; and
   a plurality of conductive contacts to provide electrical contact to the device layer.

2. The structure of claim 1, wherein the conversion layer comprises boron.

3. The structure of claim 1, wherein the device layer includes a Static Random Access Memory (SRAM) device.

4. The structure of claim 3, wherein the SRAM device, upon receiving one of the emitted charged particles, experiences a Single Event Upset (SEU).

5. The structure of claim 4, wherein the number of SEUs experienced by the SRAM device provides an indication of a quantity of neutrons detected, 6. The structure of claim 1, wherein the device layer and the buried oxide layer are remnants of a Silicon On Insulator (SOI) structure in which a substrate has been removed.

7. The structure of claim 1, wherein the adhesion layer is a low-temperature adhesion layer.

8. The structure of claim 7, wherein the adhesion layer is selected from the group comprising a spin-on dielectric, benzocyclobutene, polydimethylsiloxane, methylsilsesquioxane, polyimide, silicone, and epoxy.

9. The structure of claim 1, wherein the carrier is a supporting substrate formed in a separate fabrication process from the device layer and the buried oxide layer.

10. The structure claim 1, wherein the plurality of conductive contacts includes a contact extending from the device layer to the passivation layer.

11. The structure of claim 1, wherein the plurality of conductive contacts includes at least one top-side contact extending from the passivation layer into at least the buried oxide layer, 12. The structure of claim 11, further comprising at least one via through at least a portion of the conversion layer to at least one of the conductive contacts.

13. The structure of claim 12, further comprising at least one conductive bump filling the via and extending past the conversion layer for making electrical contact with additional circuitry not on the structure.

14. The structure of claim 11, further comprising at least one void through the conversion layer and at least a portion of the buried oxide layer to at least one of the conductive contacts.

15. The structure of claim 14, further comprising at least one wire bond secured to and making electrical contact with the at least one top-side contact.

16. The structure of claim 14, further comprising a package die pad adjacent to the carrier and opposite the adhesion layer.

17. The device of claim 1, wherein the plurality of conductive contacts are formed through at least one via formed through at least the conversion layer and the buried oxide layer.

18. The device of claim 17, further comprising at least one conductive bump filling the at least one via and extending past the conversion layer for making electrical contact with the additional circuitry outside the neutron detection device.

* * * * *